US005420885A

United States Patent [19]

May

[11] Patent Number: 5,420,885

[45] Date of Patent: May 30, 1995

[54] METHOD AND APPARATUS PERTAINING TO COMMUNICATION ALONG AN ELECTRIC FENCE LINE

[75] Inventor: Nathaniel May, Hamilton, New Zealand

[73] Assignee: Gallagher Electronics Limited, Hamilton, New Zealand

[21] Appl. No.: 884,338

[22] Filed: May 18, 1992

[30] Foreign Application Priority Data

May 17, 1991 [NZ] New Zealand ........................ 238176
Jun. 26, 1991 [NZ] New Zealand ........................ 238729
Aug. 22, 1991 [NZ] New Zealand ........................ 239506

[51] Int. Cl.[6] .......................... H03K 7/04; H03K 7/06; H03K 9/04; H04J 15/00

[52] U.S. Cl. .......................................... 375/239; 370/8

[58] Field of Search ................. 375/23, 22, 24; 370/8, 370/9, 10

[56] References Cited

U.S. PATENT DOCUMENTS

| | | | |
|---|---|---|---|
| 2,981,854 | 4/1961 | Grace et al. | 307/132 |
| 3,378,694 | 4/1968 | Griffith | 307/132 |
| 3,736,509 | 5/1973 | Munn . | |
| 4,297,633 | 10/1981 | McCutchan et al. | 324/51 |
| 4,380,746 | 4/1983 | Sun et al. . | |
| 4,859,868 | 8/1989 | McKissack | 307/106 |

*Primary Examiner*—Stephen Chin
*Assistant Examiner*—Duane Kobayashi
*Attorney, Agent, or Firm*—Lowe, Price, LeBlanc & Becker

[57] ABSTRACT

A communication device is arranged to send a communication signal in the form of code pulses down an electric fence line which is energized by electric pulses from a fence energizer. The code pulses are generated to be distinct and separate from the electric pulses generated to energize the fence. A controller is included to control the charge and discharge of an energy storage device to generate at least the code pulses to be transmitted along the electric fence line. A coupling device is also included to couple both the code pulses and the electric fence energizing signal to the fence.

8 Claims, 3 Drawing Sheets

METHOD AND APPARATUS PERTAINING TO COMMUNICATION ALONG AN ELECTRIC FENCE LINE

FIELD OF THE INVENTION

This invention relates to a method and apparatus pertaining to communications.

In particular, but not exclusively this invention relates to the sending and receiving of communication signals along a electric fence line.

BACKGROUND OF THE INVENTION

Presently, there is no effective and reliable system in place for the sending of communication signals along an electric fence line. It will be desirable however, to have such a system. For instance, if it was possible to send a trigger signal along an electric fence line from an electric fence energiser to an information station or responder, information could be sent back to the energiser. This information could include data on the status of the fence line in various places or maybe other useful parameters. These other parameters may not necessarily be associated with the electric fence itself and could perhaps be from a meteorological station or other information collecting and monitoring devices. Instead of a trigger signal, the electric fence energiser may send signals which operate machinery, such as opening or closing gates.

Security fence systems usually consist of a single series fence and therefore information about separate sectors within the security area cannot presently be readily accessed by sending communication signals along the electric fence line. With a device that can function as described above, separate fences can be used within a security system and information can be sent to and received from individual sectors within the whole of the security system. Furthermore, such a device can be useful to farmers who presently need to walk an entire farm to check if and where there are faults in their electric fence system.

Electric fence energisers have characteristics which are generally not found in other devices. For instance, electric fence energisers produce high voltage pulses at regular intervals—generally in the order of one second apart. To achieve this, an energy storage device such as a capacitor is discharged through a transformer. Standard communication means such as sending tone bursts and so forth are extremely difficult, if not impossible to electrically couple with transformers such as those used in electric fence systems. It is thought that a third winding on the energiser transformer would be required-which can be expensive and difficult to arrange. Another problem with electric fence systems is that the electric fence line or wire (transmission line) is extremely long and a signal used in standard communication means could be attenuated as it travels along the electric fence line.

As a general comment, it is very difficult to predict either mathematically or empirically if a pulse of a particular type will propagate satisfactorily along an electric fence line.

SUMMARY OF THE INVENTION

It is an object of the present invention to address the above problems or at least to provide the public with a useful choice.

Further objects and advantages of the present invention will become apparent from the following description which is given by way of example only.

According to one aspect of the present invention there is provided a communications device capable of sending a communication signal down an electric fence line comprising a first energy storage device and a second energy storage device wherein the second energy storage device is controllable so that it can be charged or discharged so that in the process thereof causes a code pulse or pulses to transmit along the electric fence line, these code pulse or pulses being separate from the normal pulses produced by an electric fence energiser.

According to an alternative aspect of the present invention there is provided a method of coupling communication pulses to an electric fence line characterised by the step of charging a second energy storage device from a first energy storage device via at least one transformer to cause a communication pulse to be generated on the electric fence line.

Reference throughout this specification will now be made to the energy storage devices being capacitors although it should be appreciated that other energy storage devices may be used, for instance inductive arrangements.

In some embodiments the communications device will be incorporated into an electric fence energiser. Preferably the first energy storage device is capable of discharging into the electric fence line in the normal operation of the electric fence energiser. As will become apparent however, there are embodiments envisaged whereby the communications device is entirely separate from the energiser.

Having a second energy storage device, the charging or discharging of which causes a pulse to be transmitted through the transformer and along the electric fence line in a similar manner to the usual operation of the electric fence energiser gives a number of advantages. For instance, there are little or no problems with coupling to the energiser transformer and a third winding is not required although in some embodiments a third winding may be utilised. Furthermore, only a minimal amount of extra components are required to add or incorporate a communications device within an electric fence energiser.

It is thought that the minimum extra components required would be an energy storage device such as a capacitor (herein referred to as a 'code capacitor') and a controllable switch that causes the capacitor to be charged or discharged into the electric fence system. In one embodiment the controllable switch may be an SCR although it is envisaged that other switching devices may be used. It is envisaged that the controllable switch would be connected to a control system the commands of which cause the SCR to be opened and closed in accordance with the coded signal that is to be sent. This control system may be incorporated into the main control system of the electric fence energiser.

The controllable switch may be triggered by any one of the following, namely passive components, integrated circuits, micro-processors, micro-controllers or personal computers. Hence the timing of the present invention can also be controlled by any one of the aforementioned devices.

It is thought that the capacitance of the code capacitor may be considerably less than the capacitance of the main energy storage capacitor in most embodiments.

This however may not be the situation in all embodiments.

The coded signal which is to be sent out may come in various forms. For instance, the information in the code may be in the height of the pulses such as found in amplitude modulation. This could be achieved by having multiple code capacitors of different values which are discharged in an order depending upon the code to be sent.

An alternative method would be to have the information stored in the actual width of the pulse itself, that is have a type of frequency modulation.

Although it is possible to use frequency and amplitude modulation with the present invention, it is thought that there may be problems with the attenuation of the signal as it travels down the electric fence line. Thus, in a preferred embodiment of the present invention it is proposed to use pulse position modulation.

With pulse position modulation, the width and height of the pulses are substantially identical, but the time between each of the pulses can be made to differ and this is the means by which the coded information can be sent. Although the amplitude and the width of a pulse can become attenuated or suffer from interference, pulse position modulation having variation only in the time domain does not suffer from these problems. It is only the time between successive charges of the code capacitor that matters. In general, regulating a parameter on a time basis is more readily accomplished than regulation based on a certain charge or voltage level.

In an alternative aspect of the present invention there is provided a method of sending a communications signal down an electric fence line characterised by the step of using pulse position modulation.

In some embodiments, the communications device which sends signals down an electric fence line may not actually be an electric fence energiser. For instance, there may be provided a communications device which is incorporated into specialised energisers that generate energiser pulses and communicate via an electric Fence. Alternatively, there may be communication devices connected to the electric Fence at permanent locations in the electric fence network. In other embodiments there may be portable devices such as hand-held units which can be connected to the electric fence at any point and at any time.

If the communications device is not incorporated into an energiser, then no energiser pulse nor the associated componentry of controllable switches and the like is necessary. The communication devices used may be transmitters only, receivers only or both transmitters and receivers.

Where the communication device is incorporated into an energiser, the energy storage device used to send a code pulse down the electric fence line may or may not be the existing energiser storage capacitor. The output transformers through which the code pulses pass may or may not be the existing energiser output transformer. There may be separate transformers used or the existing energiser transformer may also be used.

In one embodiment of the present invention, a third winding on the main energiser transformer may be used, through which the communications signal can be sent using pulse position modulation. Alternatively, a second smaller transformer may be used which is connected to the same fence line to send communication signals. Thus in some embodiments of the present invention, if pulse position modulation is used, it is not necessary to have a second energy storage device that causes a code pulse or pulses to be transmitted through the main transformer along the electric fence line.

It is envisaged that with the information which will typically be sent and received on an electric fence system, a high data rate is not necessary. It is thought that a typical coded signal sent out would have a period in the range of one microsecond to two seconds and correspond to between one and one million bits of data. The coded signal can in some embodiments actually be sent between standard pulses and without substantially interfering with the normal operation of the electric fence energiser.

It should be appreciated however that in some embodiments there may be an interruption to the normal operation of this fence energiser while a coded signal is being sent. This may be particularly appropriate in embodiments of the present invention whereby some of the charge from the main energy storage capacitor of the energiser is bled into the code capacitor of the energiser. This is also appropriate in situations whereby it is necessary to keep the overall power output of the electric fence energiser below a predetermined standard. This can be achieved by missing a single normal pulse whenever it is desired to send a coded signal.

In some embodiments it is envisaged that the start of the coded signal may be an address indicating which of the responders the energiser is signalling. For instance, a simple eight bit word may be sent out, upon receipt of which the appropriate responder sends back its data along the line. Responders on the electric fence would usually have their own DC supply (normally a battery) which is separate from the electric fence energiser supply. It is envisaged that these responders may use a similar communications device to that in the main electric fence energiser to send back the required information.

According to an alternative aspect of the present invention there is provided a method of communicating via an electric fence line with code pulses, wherein the code pulses have a similar frequency and/or power spectrum to the standard electric fence pulses.

As mentioned previously, there is uncertainty as to whether a pulse of a particular type will actually propagate along the entire length of the electric fence line without undue attenuation or other changes occurring. By providing a code pulse which has a similar frequency or power spectrum to a standard electric fence pulse, the uncertainty as to whether the pulse will propagate has been removed. The main advantage is that the frequency domain where the energy of the pulse is located is now known, and appropriate calculations may be made. It is envisaged that the code pulse could be a low energy analogue of the normal output of an electric fence pulse.

In one embodiment, communication may involve a series of signal pulses. This signal pulse train may be generated by the transmitting device connected to the electric fence. The pulse train may or may not be acknowledged by the receiving devices (with another pulse train).

The time between each pair of pulses could correspond to a four bit nybble and corresponding time intervals could correspond to those given in the table below.

| EXAMPLES OF NYBBLE AND CORRESPONDING TIME BETWEEN PULSES | |
|---|---|
| Nybble n | Time Between Pulses t (ms) |
| 0000 | 2.0 |
| 0001 | 2.5 |
| 0010 | 3.0 |
| 0011 | 3.5 |

BRIEF DESCRIPTION OF THE DRAWINGS

Aspects of the present invention will now be described by way of example only with reference to the accompanying drawings in which.

DETAILED DESCRIPTION OF PREFERRED EMBODIMENTS

Figure 1:
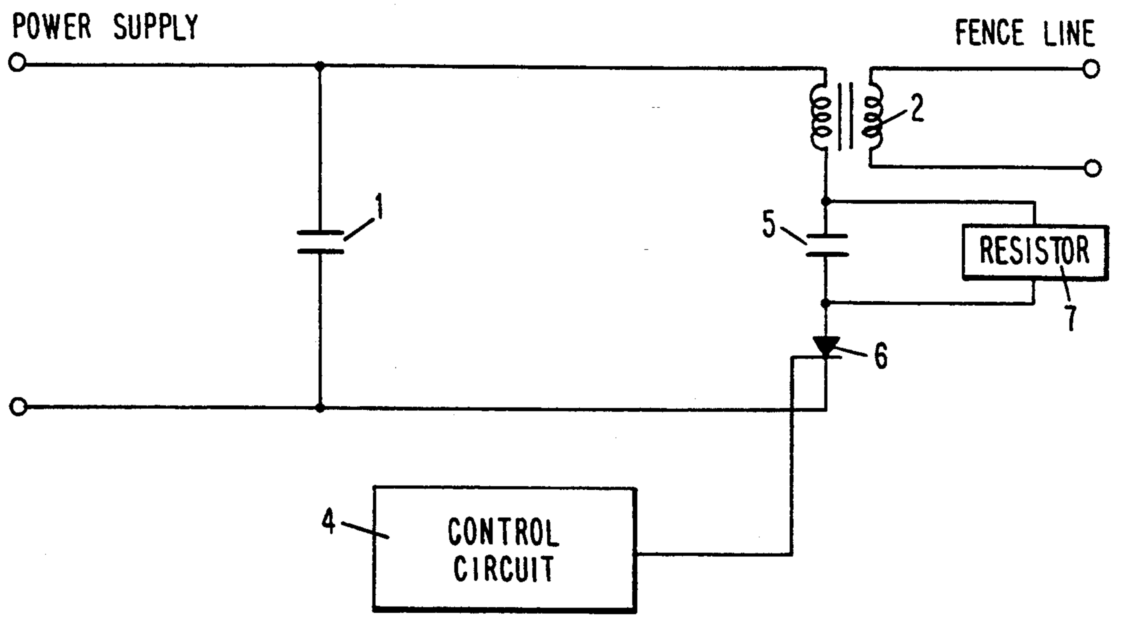
FIG. 1 is a schematic circuit diagram of one embodiment of the present invention.

FIG. 1 illustrates a typical pulse position modulation circuit including an energy storage capacitor 1, transformer 2, a control circuit 4, a further capacitor 5, a controllable switch 6 (hereinafter referred to as SCR 6) and a bleed resistor 7. This circuit can be incorporated into a variety of communication devices with or without additional componentry. The following description is of the operation of the circuit in combination with an electric fence energiser, although it should be appreciated that the circuit can be incorporated into other devices.

Figure 2:
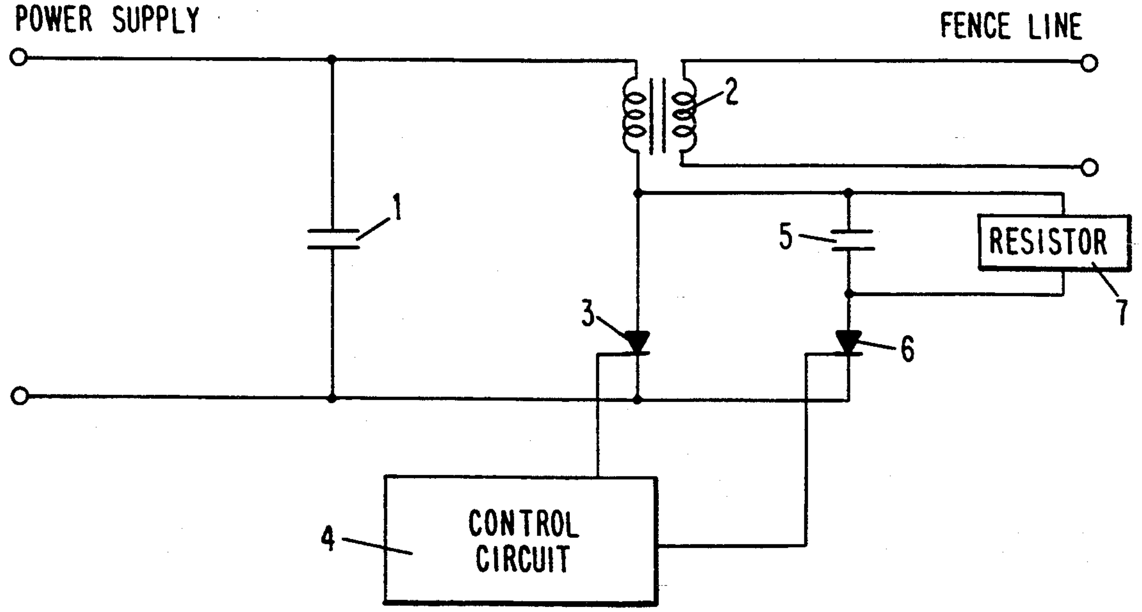
FIG. 2 is a schematic circuit diagram of the above embodiment incorporated into an electric fence energiser circuit.

FIG. 2 illustrates a standard electric fence energiser circuit comprising an energy storage capacitor 1, transformer 2, a controllable switch 3 (hereinafter referred to as SCR 3) and a control circuit 4.

In addition to the standard circuitry described above, there is a code capacitor 5, SCR 6 and a bleed resistor 7. The storage capacitor I is charged from main supply, battery, solar power or some other power. Energy on this storage capacitor 1 is used to generate signal pulses.

A pulse in a secondary coil of the transformer 2 is generated by creating the current pulse in the primary coil. A voltage is generated in the secondary coil according to the relation.

$$V_{sec} = -N_s L_p \frac{di_p}{dt} \qquad \text{Equation 1}$$

where $V_{sec}$ =the transformer secondary voltage $N_s$ =the number of secondary turns of the transformer $L_p$ =the primary inductance of the transformer $i_p$ =the current in the transformers primary coil A pulse is generated in the secondary coil of transformer 2 by discharging the storage capacitor 1 through the primary coil of the transformer 2.

The generation of the signal pulse involves blocking a complete discharge of the storage capacitor 1. Initially the main storage capacitor 1 is charged and the code capacitor 5 is uncharged. A signal pulse is generated when SCR 6 is triggered. A current pulse flows in the loop formed by the capacitor 1, the primary coil of the transformer 2, the code capacitor 5 and SCR 6 and produces a pulse in the secondary coil with characteristics as defined in Equation 1. The code capacitor 5 charges quickly until the voltages on the code Capacitor 5 and the main storage capacitor 1 match. The current then ceases and the SCR 6 switches off. The code capacitor 5 is an order of magnitude smaller than the main storage capacitor 1 so the charge lost by the storage capacitor 1 is minimal and both capacitors 1 and 5 are left charged.

Code capacitor 5 can then be discharged (by the bleed resistor 7) and the circuit is ready to produce another pulse, SCR 3 is the usual controllable switch used in energisers. The arrangement illustrated in FIG. 2 shows easily how the communication circuitry may be incorporated into a standard energiser, thus utilising the same storage capacitor and transformer.

Figure 3:
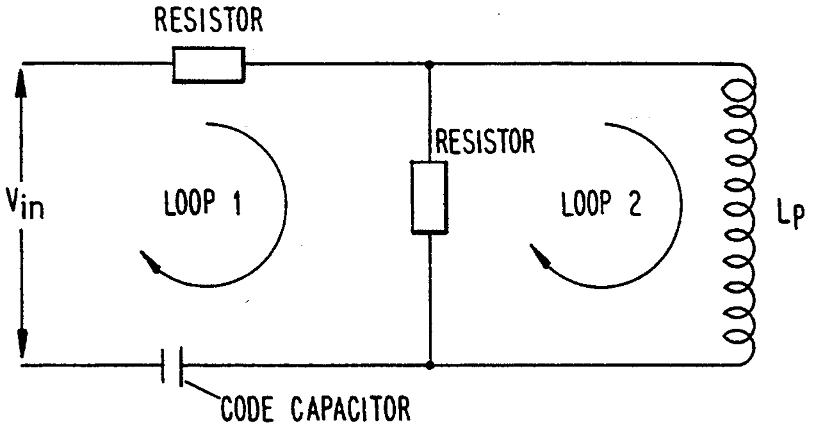
FIG. 3 is an electrical model of the primary loop of the signal pulse circuit.

FIG. 3 illustrates an electrical model of the primary loop (capacitor 1, transformer 2 primary coil, capacitor 5 and SCR 6) of the signal pulse circuit during the generation of a signal pulse.

where $i_1$ =current in loop 1

$i_2$ =current in loop 2

The description of the current in the primary coil of the output transformer during the generation of the signal pulse is $$i_2(t) = Ae^{\sigma t} \sin \omega \qquad \text{Equation 2}$$

where A, $\sigma$ and $\omega$ are constants of the circuit.

Equation 2 describes the current in the transformer primary. Substituting this expression for $i_p$ in Equation 1 yields a description of the voltage waveform of the pulse.

Figure 4:
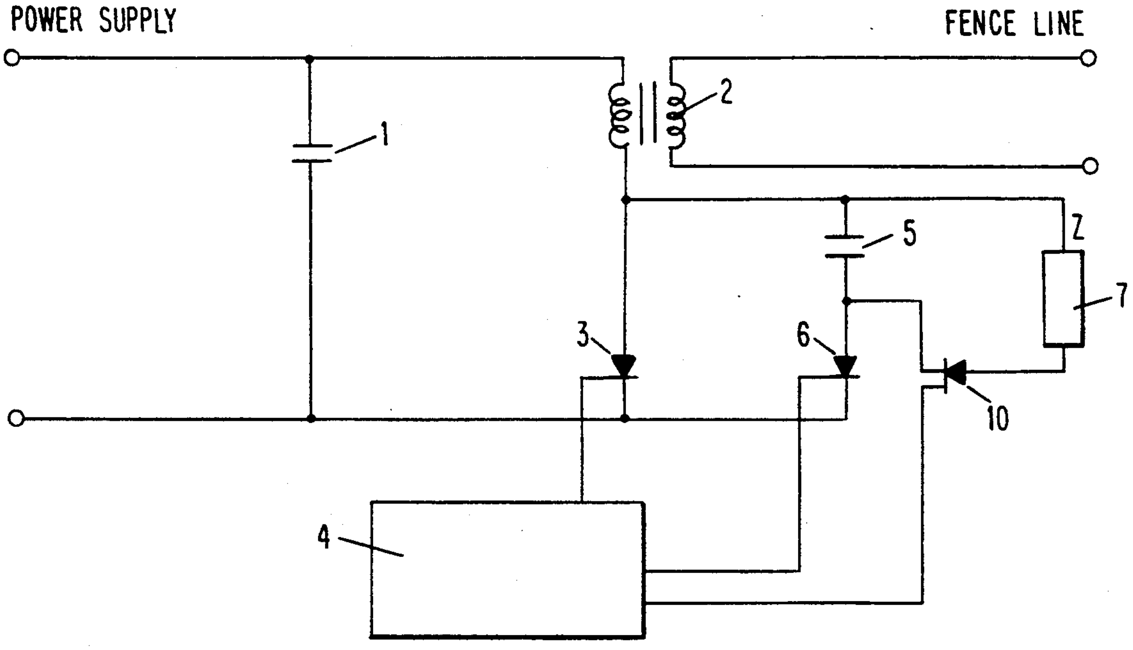
FIG. 4 is a schematic circuit diagram of another embodiment of the present invention.

We note that the generation of pulse position modulation requires signal pulses closely spaced in time. The system must be returned to the original condition before another signal pulse can be generated. We therefore require that the storage capacitor 1 is charged and Chat the code capacitor 5 is uncharged. After the generation of a signal pulse, the capacitor 5 is charged and therefore must be discharged before another signal pulse can be generated. This is achieved by the bleed resistor 7 (FIGS. 1 and 2). The bleed resistor 7 discharges the capacitor 5 slowly. By placing the bleed resistor 7 in series with the controllable switch 10 (as illustrated in FIG. 4), the capacitor 5 can be discharged faster than in the arrangement illustrated in FIGS. 1 and 2. In this embodiment the capacitor 5 is discharged by triggering the controllable switch 10 which enables the bleed resistor 7 to have lesser resistance, thereby allowing the capacitor 5 to discharge faster.

Figure 5:
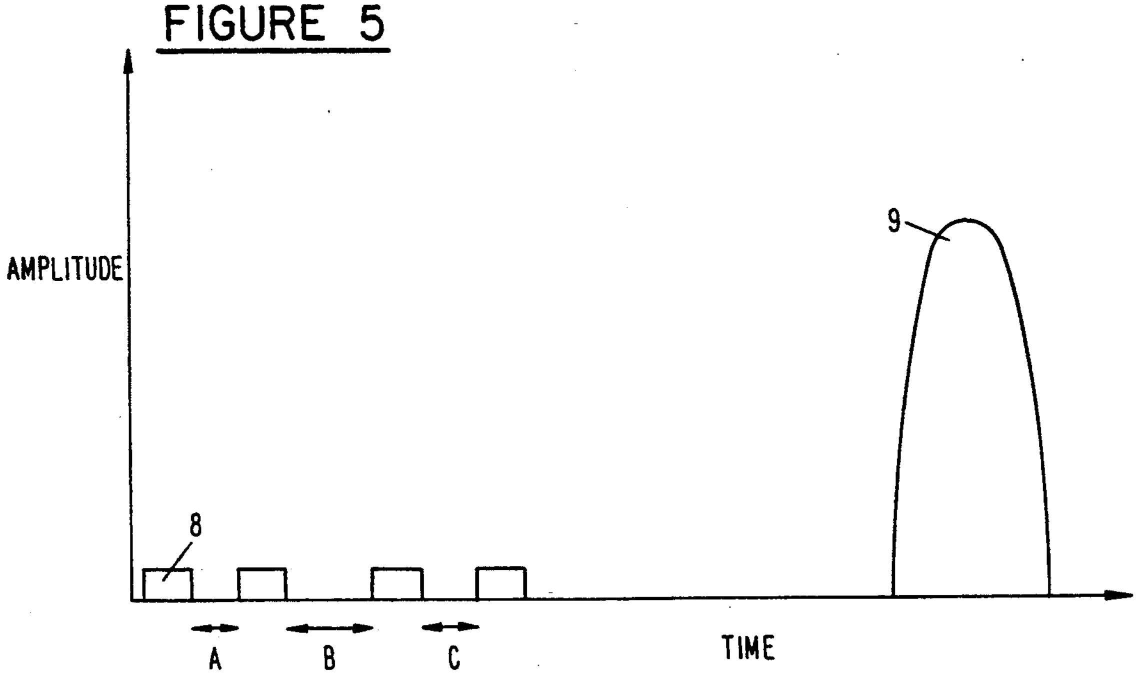
FIG. 5 is a graphical representation of one possible pulse sequence.

FIG. 5 is a graphical representation of a possible coding sequence. It should be appreciated that the magnitudes of the pulses and the times between them are not proportionally represented.

The horizontal axis of the graph represents time units and the vertical axis represents the amplitude of the pulses. Near the origin of the graph are a number of pulses of even height and regular width indicated by numeral 8. The actual difference in time between each of these pulses 8 is represented by arrows A, B and C. It can be seen that the lengths of arrows A, B and C are different and it is these differences which give the coding information. To the right of the graph is pulse 9 which is of considerable larger amplitude and width than the pulses 8. Pulse 9 represents a standard electric fence pulse. It is envisaged that in some embodiments the sequence of coded pulses 8 would last for approximately 10–50 milliseconds whereas the time between pulses 9 would be in the order of 1 second. Thus, if the graph illustrated in FIG. 4 was represented proportionally, the gap between the pulses 8 and pulse 9 would be considerably larger.

Figure 6:
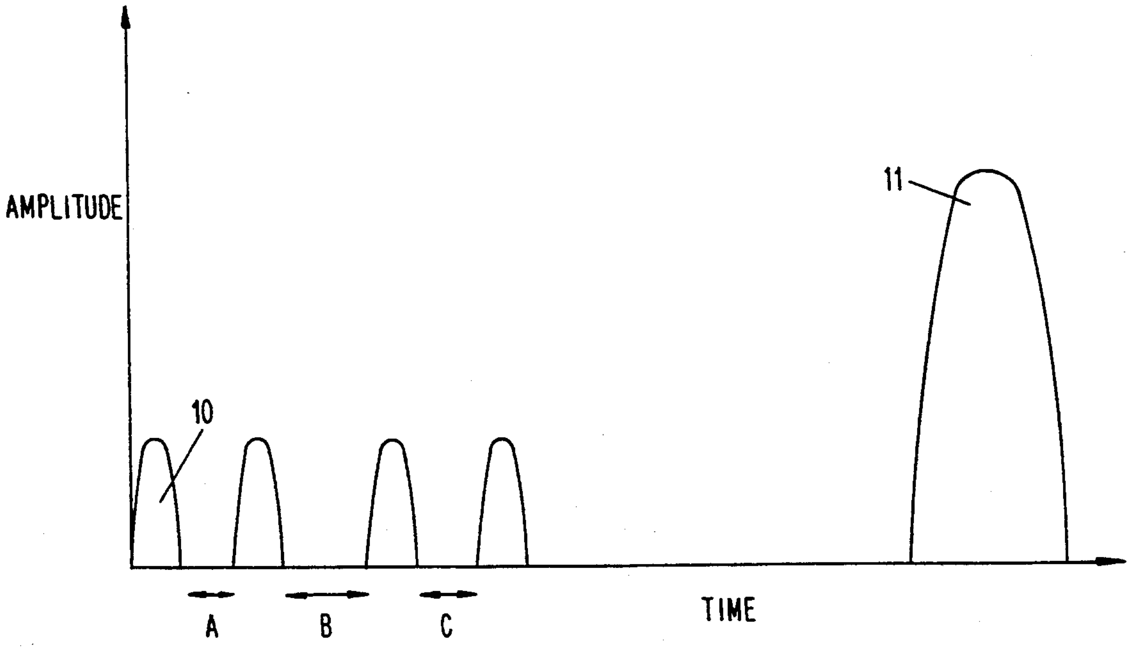
FIG. 6 is a graphical representation of an alternative pulse sequence.

FIG. 6 is another graphical representation of a possible coding sequence. In FIG. 5 the code pulses 8 were illustrated as being digital pulses. In FIG. 6 the code pulses 10 are substantially the same shape as the electric fence pulse 11. Although the code pulses 10 are smaller in amplitude than the electric fence pulse 11, they have the same frequency spectrum with the same proportionate amount of energy for each frequency across the spectrum. As the code pulses 10 are similar to the electric fence pulse 11, they will propagate along the electric fence line in a similar manner to the standard electric fence pulse 11.

Aspects of the present invention have been described by way of example only and it should be appreciated that modifications and additions may be made thereto without departing from the scope of the appended claims.

I claim:

1. A communication device arranged to send a communication signal down an electric fence line energized by electric pulses from a fence energizer, said communications device comprising:

first energy storage device;

a second energy storage device;

a coupling device connected to said electric fence line and operatively connected to said communications device and said fence energizer; and a controller, said controller arranged so as to control the charge and discharge of said second energy storage device to generate at least code pulses to be transmitted along said electric fence line via said coupling device, wherein said code pulses are generated so as to be distinct and separate from said electric pulses generated by said fence energizer, wherein said first energy storage device is part of said fence energizer, said first energy storage device being charged and discharged to provide said electric pulses to said electric fence line via said coupling device, and wherein said charging and discharging of said first energy storage device is controlled by said controller.

2. The communications device of claim 1 wherein said first energy storage device is charged and discharged according to said controller so as to generate communication pulses transmitted to said electric fence line via said coupling device.

3. A communication device arranged to send a communication signal down an electric fence line energized by electric pulses from a fence energizer, said communications device comprising:

a first energy storage device;

a second energy storage device;

a coupling device connected to said electric fence line and operatively connected to said communications device and said fence energizer; and a controller, said controller arranged so as to control the charge and discharge of said second energy storage device to generate at least code pulses to be transmitted along said electric fence line via said coupling device, wherein said code pulses are generated so as to be distinct and separate from said electric pulses generated by said fence energizer, wherein said first energy storage device is part of said fence energizer, said first energy storage device being charged and discharged to provide said electric pulses to said electric fence line via said coupling device, wherein said electric pulses are interrupted to create a time period during which said code pulses are generated and transmitted to said electric fence line.

4. A communication device arranged to send a communication signal down an electric fence line energized by electric pulses from a fence energizer, said communications device comprising:

a first energy storage device;

a second energy storage device;

a coupling device connected to said electric fence line and operatively connected to said communications device and said fence energizer;

a controller, said controller arranged so as to control the charge and discharge of said second energy storage device to generate at least code pulses to be transmitted along said electric fence line via said coupling device, and a second controllable switch coupled to said controller, wherein said code pulses are generated so as to be distinct and separate from said electric pulses generated by said fence energizer, and wherein a controllable switch is connected to said controller to effect said charging and discharging of said second energy storage device.

5. The communications device of claim 4 further comprising a bleed resistor connected in parallel across said second energy storage device.

6. The communications device of claim 5 further comprising a third controllable switch connected in series with said bleed resistor.

7. A communication device arranged to send a communication signal down an electric fence line energized by electric pulses from a fence energizer, said communications device comprising:

a first energy storage device;

a second energy storage device;

a coupling device connected to said electric fence line and operatively connected to said communications device and said fence energizer; and a controller, said controller arranged so as to control the charge and discharge of said second energy storage device to generate at least code pulses to be transmitted along said electric fence line via said coupling device, wherein said code pulses are generated so as to be distinct and separate from said electric pulses generated by said fence energizer, wherein said first energy storage device is part of said fence energizer, said first energy storage device being charged and discharged to provide said electric pulses to said electric fence line via said coupling device, wherein said charging and discharging of said first energy storage device is controlled by said controller, wherein said first energy storage device is charged and discharged according to said controller so as to generate communication pulses transmitted to said electric fence line via said coupling device, and wherein said code pulses have a similar frequency and power spectrum to said electric pulses.

8. A method of sending a communication signal down an electric fence line energized by electric pulses from a fence energizer, comprising the step of transmitting a set of code pulses separate and distinct from said electric pulses down said fence line, wherein said electric pulses are interrupted to create a time period during which said code pulses are transmitted.

* * * * *